United States Patent [19]

Fuse et al.

[11] Patent Number: 5,217,501
[45] Date of Patent: Jun. 8, 1993

[54] VERTICAL WAFER HEAT TREATMENT APPARATUS HAVING DUAL LOAD LOCK CHAMBERS

[75] Inventors: Noboru Fuse, Yokohama; Hirofumi Kitayama, Aikawa; Hisashi Hattori, Tama, all of Japan

[73] Assignees: Tokyo Electron Limited, Tokyo; Tokyo Electron Sagami Limited, Kanagawa, both of Japan

[21] Appl. No.: 729,836

[22] Filed: Jul. 12, 1991

Related U.S. Application Data

[63] Continuation of Ser. No. 554,447, Jul. 19, 1990, abandoned.

[30] Foreign Application Priority Data

| | | |
|---|---|---|
| Jul. 25, 1989 [JP] | Japan | 1-192172 |
| Jul. 25, 1989 [JP] | Japan | 1-192173 |
| Jul. 25, 1989 [JP] | Japan | 1-192174 |
| Jan. 23, 1990 [JP] | Japan | 2-13294 |

[51] Int. Cl.$^5$ .............. H01L 21/30; H01L 21/46; H01L 21/50; C23C 14/56
[52] U.S. Cl. .................. 29/25.01; 118/719; 118/50.1
[58] Field of Search ........... 29/25.01; 414/152, 404, 414/406, 217; 437/247; 156/646; 148/DIG. 6; 118/719, 50.1

[56] References Cited

U.S. PATENT DOCUMENTS

| | | | |
|---|---|---|---|
| 4,915,777 | 4/1990 | Jucha et al. | 156/643 |
| 4,923,584 | 5/1990 | Bramhall, Jr. et al. | 204/298.35 |
| 4,938,691 | 7/1990 | Ohkase et al. | 414/152 |
| 5,015,330 | 5/1991 | Okumura et al. | 156/643 |
| 5,067,218 | 11/1991 | Williams | 29/25.01 |

FOREIGN PATENT DOCUMENTS

0178336 4/1986 European Pat. Off. .......... 29/25.01

*Primary Examiner*—Olik Chaudhuri
*Assistant Examiner*—David E. Graybill
*Attorney, Agent, or Firm*—Oblon, Spivak, McClelland, Maier & Neustadt

[57] ABSTRACT

A vertical wafer heat treatment apparatus for for forming a film on and dry etching a plurality of wafers stored in a wafer boat. The apparatus has at least first and second load lock chambers connected by a gate. Each load lock has an inert gas independently introduced therein and exhausted therefrom. The load lock chambers are vertically connected between two separate process containers. An elevator is provided in the first load lock chamber to transfer a wafer boat into and out of the first container. A transfer means is provided in the second load lock to transfer wafers into and out of a wafer boat.

20 Claims, 11 Drawing Sheets

VERTICAL WAFER HEAT TREATMENT APPARATUS HAVING DUAL LOAD LOCK CHAMBERS

This application is a continuation of application Ser. No. 07/554,447, filed on Jul. 19, 1990, now abandoned.

BACKGROUND OF THE INVENTION

1. Field of the Invention

The present invention relates to a vertical heat treatment apparatus and a treatment method using the vertical heat treatment apparatus.

2. Description of the Prior Art

With recent development in integration degree of an LSI, the density of arrangement of, e.g. MOS FET has increased. In the case, a 1M or 4M DRAM, a minimum design width is less than 1 $\mu$m, and the thickness of a gate oxide film is less than 200 Å. In the case of a 16M DRAM, the thickness of a gate oxide film is further decreased to about 100 to 150 Å. When a silicon surface is wet-rinsed with HF or HCl, it remains clear for a time just after rinsing. However, the rinsed silicon surface reacts immediately with oxygen or moisture in the air, and a natural oxidation film about 10 Å thick forms on the silicon surface.

In the case of a horizontal furnace, a boat on which semiconductor wafers are mounted is loaded horizontally in a reaction tube heated, e.g. up to 1000° C. In this case, air enters the reaction tube inevitably, because of convection current due to a temperature difference between the inside of the furnace and the outside thereof. Thus, when a wafer is loaded in the horizontal furnace, a natural oxidation film having a thickness of 50 to 100 Å forms inevitably as a result of a reaction between the heated wafer and oxygen in the air. A natural oxidation film is porous and has a low quality. Therefore, when a high-density element is fabricated, in which the thickness of a gate oxide film must be controlled, the horizontal furnace is undesirable because of its structural problems.

On the other hand, less oxygen is taken in a vertical furnace, compared to the horizontal furnace. In the case of the vertical furnace, the thickness of a formed natural oxidation film is small, i.e. 30° to 50° C. Thus, vertical furnaces are now widely used in the fabrication of 1M DRAMs.

In the case of the vertical furnace, however, when 4M or 16M DRAMs that require higher integration are manufactured, it is necessary to prevent the formation of a natural oxidation film due to the air entering at the time of loading/unloading, and the moisture adsorbed on the wafer.

ELECTRONIC MATERIAL, March 1989, pp. 38-39, discloses a structure for strictly controlling the atmosphere in which a wafer is loaded in a vertical furnace.

According to a load-lock method disclosed in ELECTRONIC MATERIAL, a mechanism for vertically moving a boat, and other parts arranged in a lower part of the vertical furnace are arranged within a load-lock chamber. After a vacuum is built in the load-lock chamber, an inert gas such as nitrogen is filled in the chamber. Then, the boat is loaded. Oxidation of the wafer at the time of loading is thus prevented, and formation of a natural oxidation film is effectively suppressed. The load-lock chamber is connected to a sub chamber, whereby the wafer is loaded into and unloaded from the load-lock chamber in a nitrogen atmosphere.

Published Unexamined Japanese Patent Application No. 62-263642 discloses a technique wherein a vacuum sub chamber is connected to a plasma vapor-phase deposition apparatus, and a wafer is prebaked in the vacuum sub chamber to eliminate moisture.

In the above-described prior art, the thickness of the natural oxidation film is reduced to a minimum by loading the wafer in the vertical furnace in the atmosphere free from oxygen. However, with an increase in integration degree of semiconductor devices, the thickness of the oxide film must be controlled more finely, and it is insufficient to suppress the formation of the natural oxidation film at the time of loading the wafer in the vertical furnace. It is necessary to prevent the formation of the natural oxidation film of the thickness of 10 Å, which is formed, during the transfer of the rinsed wafer to a heat treatment furnace, owing to the reaction of silicon with oxygen or moisture in the air.

In addition, in treatment apparatuses, other than the oxide film forming apparatus, for forming a polysilicon film or a capacitor film which must have a low contact resistance, it is necessary to remove an unnecessary natural oxidation film and to increase the yield of semiconductor devices.

SUMMARY OF THE INVENTION

The object of the present invention is to provide a method and an apparatus for removing a natural oxidation film on an object, though the formation of the natural oxidation film is recognized, before the object is subjected to a main treatment step, e.g. of forming a film, and preventing the formation of a natural oxidation film while the object is loaded for the step of forming the film. In the apparatus, a vertical treatment furnace is used also as an etching container, or local etching is enabled in the vertical treatment furnace, or etching is effected in a container other than the vertical treatment furnace. In the apparatus, a plurality of objects are etched one by one.

The etching method may employ hydrogen fluoride, nitrogen, a reducing gas, plasma etching using an electrode, a combination of heating by a heater and gas, etc.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments 1 to 7 of the present invention as applied to a vertical CVD apparatus will now be described in detail with reference to the accompanying FIGS. 1 to 12.

Embodiment 1

Figure 1:
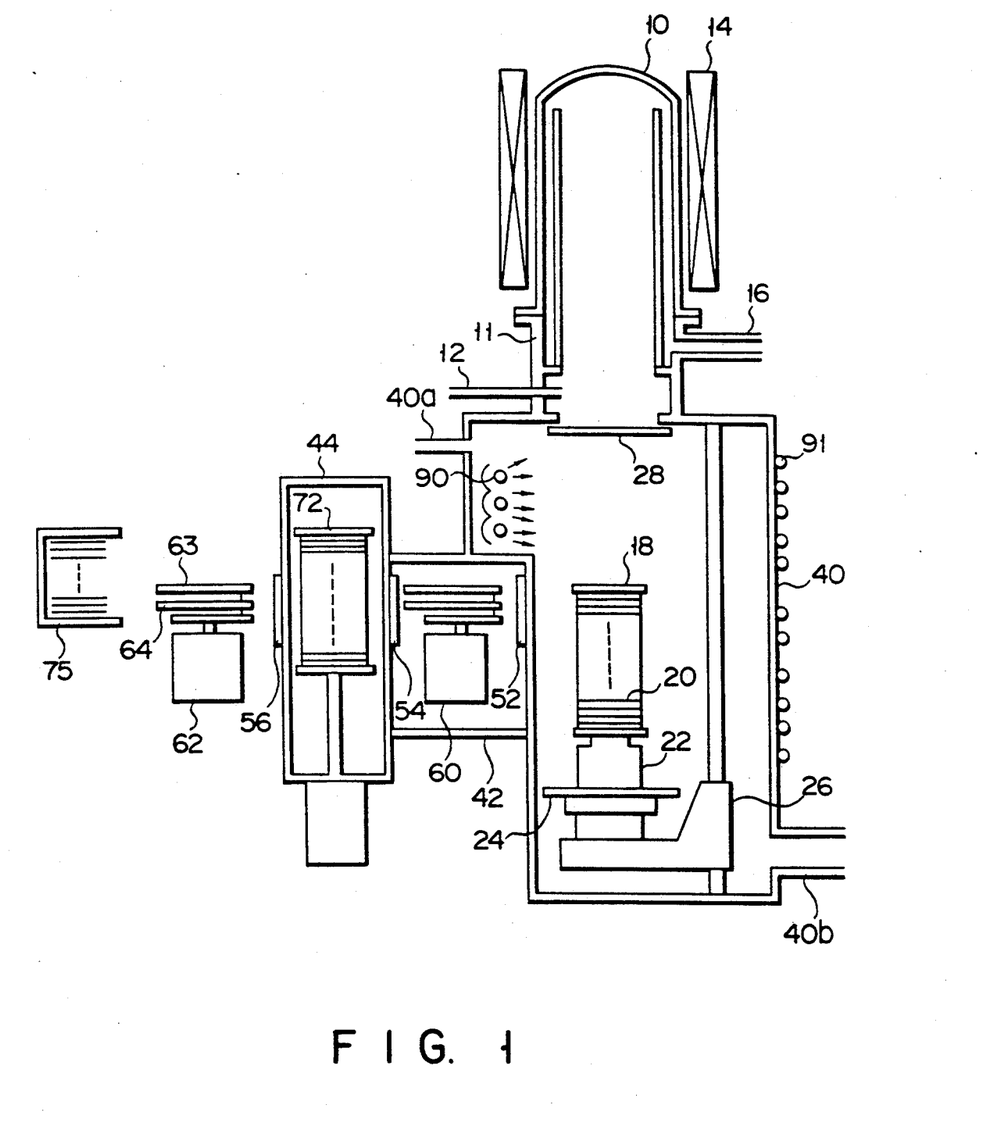
FIG. 1 is a schematic view of a vertical CVD apparatus according to an embodiment of the present invention.

In FIG. 1, a process tube 10 is formed of, e.g. quartz in a cylindrical shape. The longitudinal axis of the process tube 10 is situated vertically. The process tube 10 constitutes a vertical heat treatment unit. A gas-introducing pipe 12 is connected to one end of a manifold 11 arranged at a lower part of the process tube 10. The gas-introducing pipe 12 allows the passage of $O_2$ for forming an oxide film by means of CVD, $SiH_4$ for forming a polysilicon film, $NH_4$ and $SiH_2Cl_2$ for forming a silicon nitride film, and a purge gas such as $N_2$. In addition, a cleaning gas for removing a natural oxidation film on a wafer 20 is let to flow through the pipe 12. The cleaning gas is, for example, a plasmaless etching gas such as $NF_3$ or HCl, a reducing gas such as $H_2$, etc. The gas-introducing pipe 12 may be provided at an upper part of the process tube 10. A heater 14 is arranged around the process tube 10 to heat the inside of the tube 10 up to a predetermined temperature (e.g. 500° to 1000° C. in the case of CVD, or 800° to 1200° C. in the case of oxidation or diffusion). An exhaust pipe 16 is connected to the other end of the manifold 11. The exhaust pipe 16 is connected to a vacuum pump (not shown). The gas inside the process tube 10 is exhausted through the exhaust pipe 16, thereby setting the inside of the tube 10 to a predetermined degree of vacuum, or the gas introduced into the process tube 10 is exhausted through the exhaust pipe 16.

A wafer boat 18 for treating a number of wafers 20 as a batch can be put in the process tube 10. The wafers 20 are mounted on the boat 18, with each wafer kept horizontal. The wafers 20 are arranged at predetermined intervals in the vertical direction. The boat 18 is secured on a heat-insulating cylinder 22 for setting the wafers 20 in a uniform-temperature region of the process tube 10. The heat-insulating cylinder 22 is vertically moved by a boat elevator 26, so that the boat 18 may be loaded/unloaded in/from the process tube 10. A flange 24 is formed at a lower end portion of the heat-insulating cylinder 22. After the boat 18 is loaded in the process tube 10, the flange 24 closes the lower opening of the manifold 11. On the other hand, after the boat 18 is completely unloaded from the process tube 10, a shutter 28 is closed to seal the lower opening of the manifold 11.

The apparatus according to this embodiment adopts a load-lock system for suppressing the formation of a natural oxidation film on the surface of the wafer 20 as much as possible.

A first load-lock chamber 40 is defined below the process tube 10. The first load-lock chamber 40 includes a vertical movement mechanism of the boat elevator 26. A second load lock chamber 42 including a wafer convey arm 60 is arranged on the left (in FIG. 2) of the first load-lock chamber 40. Further, a third load-lock chamber 44 is arranged on the left of the second load-lock chamber 42. A vacuum is built in the first load-lock chamber 40. The first load-lock chamber 40 is connected to a gas-introducing pipe 40a and an exhaust pipe 40b through which a non-oxidizing gas such as an inert gas may be caused to purge the inside of the first load-lock chamber 40. Similarly, gas-introducing pipes and exhaust pipes (not shown) are connected to the second and third load-lock chambers 42 and 44.

Figure 2:
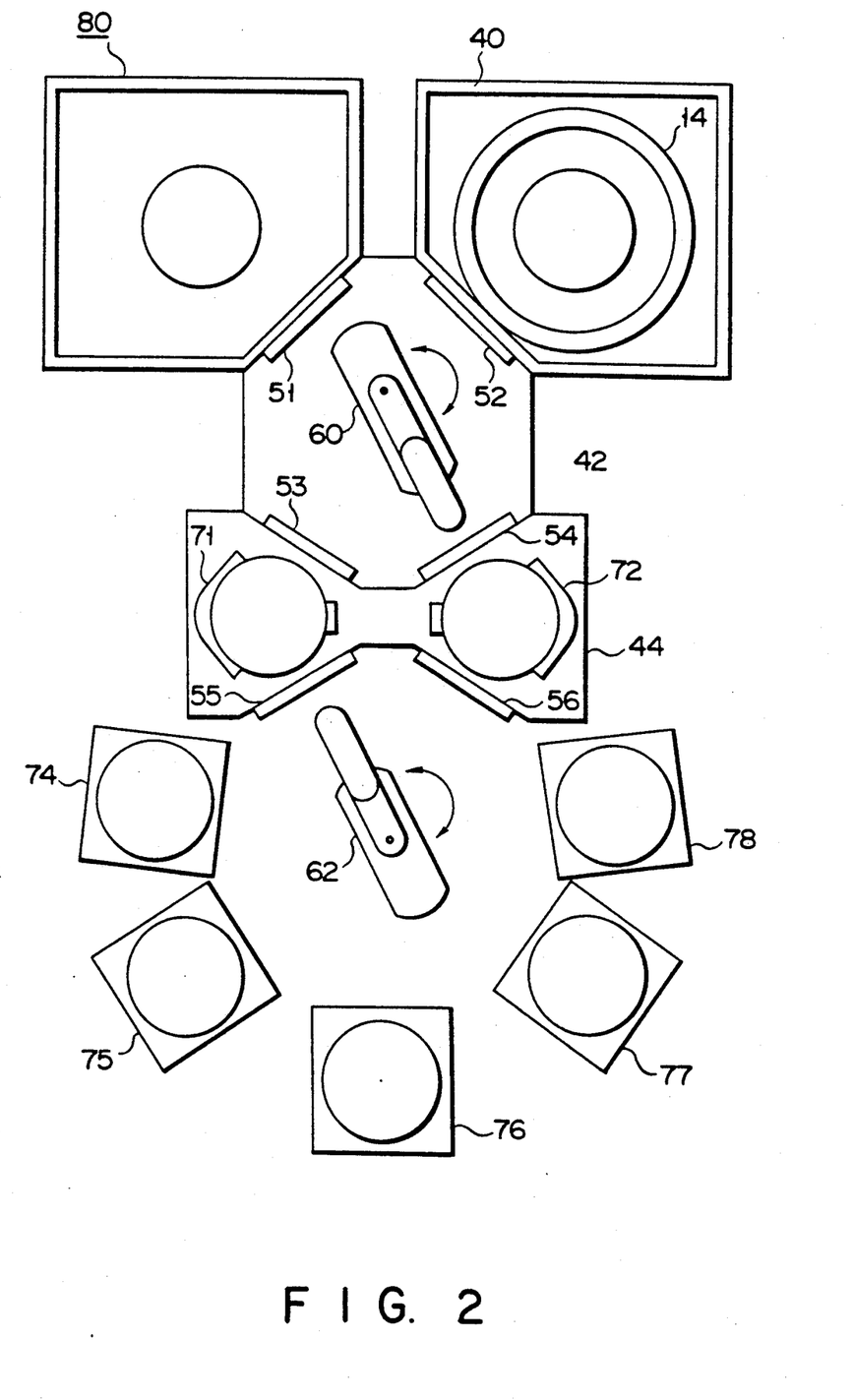
FIG. 2 is a schematic view for explaining load-lock chambers employed in the apparatus shown in FIG. 1.

Gate valves 51 to 56, as shown in FIG. 2, are provided on the side surfaces of the load-lock chambers 40, 42 and 44, in order to hermetically seal the inside of each load-lock chamber.

Wafer stockers 71 and 72 capable of stocking a number of wafers 20 are arranged in the third load-lock chamber 44. The wafers 20 are taken out one by one from the stocker 71, and are transferred onto the boat 18 arranged within the first load-lock chamber 40. After the treatment is completed in the process tube 10, the wafers 20 are transferred one by one from the boat 18 to the stocker 72 in the third load-lock chamber 44. After all wafers 20 have been transferred, the wafers 20 are then conveyed from the third load-lock chamber onto cassettes 74 to 78 by means of a convey arm 62.

The stockers 71 and 72 and cassettes 74 to 78 can be vertically moved by means of a vertical movement mechanism (not shown).

Each of the wafer convey arms 60 and 62 is rotatable and extendible.

As is shown in FIG. 2, the second load-lock chamber 42 is connected to a dry etching unit 80 via the gate valve 51.

Figure 3:
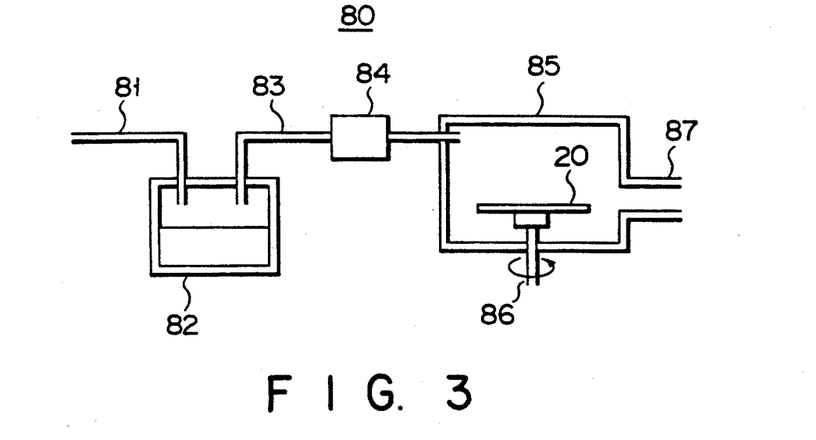
FIG. 3 is a schematic view of a single wafer type dry etching unit in the embodiment of FIG. 1.

In the dry etching unit 80, as shown in FIG. 3, a gas-introducing pipe 81 is connected to one end portion of a container 82 containing hydrogen fluoride. A gas exhaust pipe 83 is connected to the other end portion of the container 82. The container 82 is connected to a treatment container 85 via a mass flow controller 84. The wafer 20 is placed on a rotational section 86 within the treatment container 85. The wafer 20 is attached to the rotational section 86 by a sucking force produced from a vacuum source (not shown). An exhaust pipe 87 is connected to a side surface of the container 85, and the gas in the container 85 is exhausted by an exhaust device (not shown). The treatment container 85 communicates with one end of a load-lock chamber (not shown) via a gate valve (not shown). The other end of the load-lock chamber communicates with the second load-lock chamber 42 via the gate valve 51.

The inner surfaces of the container 82 and treatment container 85, which are exposed to hydrogen fluoride gas, are coated with fluoroplastics.

For example, halogen lamps or xenon lamps 90 (FIG. 1) are arranged within the first load-lock chamber 40 and in the vicinity of the opening of the process tube 10. A pipe 91 is wound around the first load-lock chamber 40. Two forks 63 and 64, which are separately operable, are provided on each of the wafer convey arms 60 and 62.

The side surface of the first load-lock chamber 40 is provided with a maintenance door (not shown) which is openable with an O-ring employed as a seal member. The size of the maintenance door is determined such that the boat 18 and the heat-insulating cylinder 22 can be put in or taken out of the load-lock chamber 40. An inside observation window and an inside observation TV camera are provided on the first load-lock chamber 40 or on a part of the maintenance door. An illumination lamp (not shown) is arranged within the first load-lock chamber 40.

In the apparatus shown in FIG. 1, the vertical treatment furnace is coupled to the single wafer etching unit in a load-lock manner. A description will now be given of how the wafers are treated in the apparatus.

In FIG. 2, the gate valve 55 is opened, and the wafers 20 stored in the cassettes 74 to 78 are successively conveyed to the stocker 71 by means of the convey arm 62. Then, the gate valve 55 is closed, and the gas in the third load-lock chamber 44 is exhausted through an exhaust pipe (not shown) thereby building a vacuum in the chamber 44. In this state, the gate valve 53 is opened to allow the second and third load-lock chambers 42 and 44 to communicate with each other in a vacuum condition. The valve 51 is opened, and the wafers 20 in the stocker 71 are transferred one by one to the dry etching unit 80 by means of the convey arm 60. The wafers 20 are mounted on the rotational section 86 in the treatment container 85 (FIG. 3) through the load-lock chamber (not shown) within the dry etching unit 80. Then, $N_2$ gas is introduced through the pipe 81, and a mixture of $N_2$ gas and hydrogen fluoride gas is supplied to the treatment chamber 85.

The wafer 20 is attached to the rotational section 86 by vacuum sucking force, and is rotated. A natural oxidation film on the wafer 20 is dry-etched with hydrogen fluoride. Since the wafers are etched one by one, they are etched surely and uniformly, and the precision of products is enhanced.

SEMICON OSAKA, May 22, 1989, Kikuyama et al., HASHIMOTO KASEI KABUSHIKI KAISHA, shows the data relating to oxide film etching using HF gas. According to this data, in the range of temperature between 4° C. to 50° C., the dry etching rate is highest at the temperature of 20° C.

In general, $SiO_2$ reacts with HF in the presence of $H_2O$ (formula (1), below) or in the absence of $H_2O$ (formula (2)). The etching rate is increased in the presence of $H_2O$.

$$SiO_2 + 4HF + 2H_2O \rightarrow SiF_4 + 4H_2O \quad (1)$$

$$SiO_2 + 4HF \rightarrow SiF_4 + H_2O \quad (2)$$

In both cases of formulae (1) and (2), $H_2O$ which is produced by the reaction is removed by the exhaust device, and there is no problem. Thus, in order to accelerate the etching reaction on the wafer 20, $N_2$ including vapor may be introduced as carrier gas to the treatment container 85.

The etching gas is not limited to HF, and may be an acid gas such as hydrochloric acid (HCl) or nitric acid ($HNO_3$).

The wafer 20, from which the natural oxidation film has been removed, is conveyed to the stocker 71 by means of the convey arm 60 through the load-lock chamber within the dry etching unit 80. This operation is repeated. After all natural oxidation films of the wafers 20 are removed, the gate valve 51 is closed.

The gate valve 52 of the first load-lock chamber 40, from which gas is exhausted through the exhaust pipe 40b to build a vacuum therein, is then opened, and the wafers 20 stored in the stocker 71 are transferred onto the boat 18 arranged in the first load-lock chamber 40. While the position of the boat 18 is changed by the elevator 26, a desired number of wafers 20 are successively transferred. Thereafter, the gate valve 52 is closed. The xenon lamps 90 are lighted, and the wafers 20 on the boat 18 are raised by the elevator 26 up to the side of the lamps 90. The wafers 20 are preheated to remove the etching residue such as fluorine and moisture adsorbed on the surfaces of the wafers 20.

The shutter 28 is opened, and the boat 18 retaining the wafers 20 are loaded by the elevator 26 into the uniform-temperature region of the process tube 10. The lower opening of the process tube 10 is sealed by the flange 24, and gas is exhausted from the process tube 10 through the exhaust pipe 16 to build a vacuum in the tube 10. Then, a predetermined process gas, e.g. $SiH_4$ in the case of forming a polysilicon film, is supplied through the gas-introducing pipe 12.

The process tube 10 is heated by the heater 14 to a predetermined process temperature, e.g. 500° to 700° C. in the case of forming a polysilicon film. The process gas is supplied to form a film on the wafer 20.

When a silicon nitride film is formed, the temperature of the tube 10 is set to 650° to 850° C., and $SiH_2C_2$ gas and $NH_3$ gas is introduced. When oxidation or diffusion is carried out, the temperature of the tube 10 is set to 800° to 1200° C., and process gas such as $O_2$ or $N_2$ is introduced. After films have been formed in the process tube 10, the boat 18 is unloaded by the boat elevator 26.

The wafers 20 are left in the first load-lock chamber 40 until the temperature of the wafers 20 lowers to a desired value, e.g. 50° C. or less. Needless to say, the wafers 20 may be cooled forcibly. For example, a non-oxidizing inert gas such as $N_2$ is introduced through the pipe 40a to shorten the cooling time of the wafers 20. In this case, it is effective even if in the pressure is several Torr.

The second and third load-lock chambers 42 and 44 are purged with $N_2$, and when the pressure in therein becomes equal to that in the first load-lock chamber, the gate valves 52 and 54 are opened.

The wafers 20 stored on the boat 18 are successively conveyed to the stocker 72 by means of the convey arm 60.

Then, the gate valve 54 is closed and the third load-lock chamber 44 is further purged with $N_2$ gas. The gate valve 56 is opened when the pressure in the third load-lock chamber 44 becomes equal to the atmospheric pressure. The wafers 20 stored in the stocker 72 are successively conveyed to the cassettes 74 to 78 by means of the convey arm 62, and the treatment of the batch of wafers is completed.

According to the above process, the natural oxidation films on the wafers 20 are removed by the dry etching unit 80, and subsequently films are formed on the wafers 20, while the wafers 20 are not bought into contact with air. In addition, a residue such as fluorine after the dry etching can be thermally removed by the lamps 90.

Regarding the forks 63 and 64 of each of the convey arms 60 and 62, it is desirable that the fork 63 be used before the formation of the films and the fork 64 be used after the formation of the films, thereby to prevent cross-contamination. In addition, it is desirable that the stocker 71 be used before the formation of the films and the stocker 72 be used after the formation of the films, thereby to prevent cross-contamination.

When the wafers 20 subjected to the heat treatment are unloaded by the elevator 26, the first load-lock chamber 40 is heated by heat radiation from the heated wafers 20. Thus, cooling water is let to flow through the pipe 91 to cool the first load-lock chamber 40. In addition, when the first load-lock chamber 40 is exposed to the outside atmosphere for the purpose of maintenance, etc., moisture in the air may adhere to the inside of the load-lock chamber 40. This makes it impossible to attain a desired degree of vacuum in a short time. To solve this problem, hot water may be let to flow through the pipe 91 to bake the load lock chamber 40.

When the films are formed, unnecessary process products adhere to the process tube 10, quartz board 18, heat-insulating cylinder 22, etc. in the vertical heat treatment unit. In order to remove such products, dry etching gas such as $NF_3$ may be supplied to the process tube 10.

The single wafer type etching method for etching wafers may be replaced with a plasma etching method, which will be described later.

Embodiment 2

Figure 4:
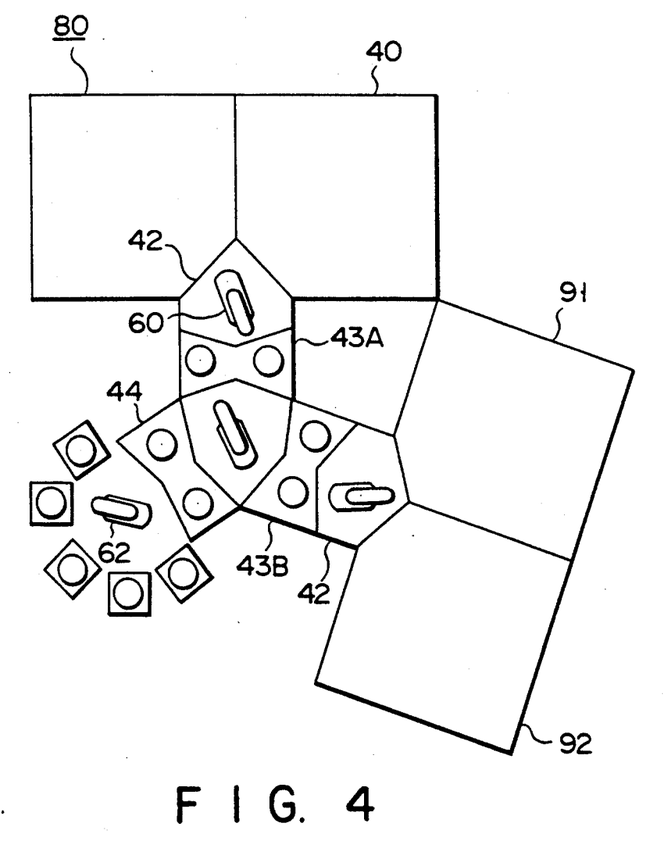
FIG. 4, FIG. 5, and FIG. 6 show modifications of the invention.

FIG. 4 shows a continuous treatment apparatus according to a second embodiment of the present invention.

Fourth load-lock chambers 43A and 43B are formed between the second load-lock chamber 42 and the third load-lock chamber 44, and treatment units 91 and 92 are added.

If the treatment units 91 and 92 are replaced with film-forming units, they can produce 0-N-0 films of capacitors. The treatment unit 91 may be replaced with a film-thickness measuring device, a contamination examining device, or phosphorous concentration measuring device, thereby to perform in-line measurement monitoring.

Embodiment 3

Figure 5:
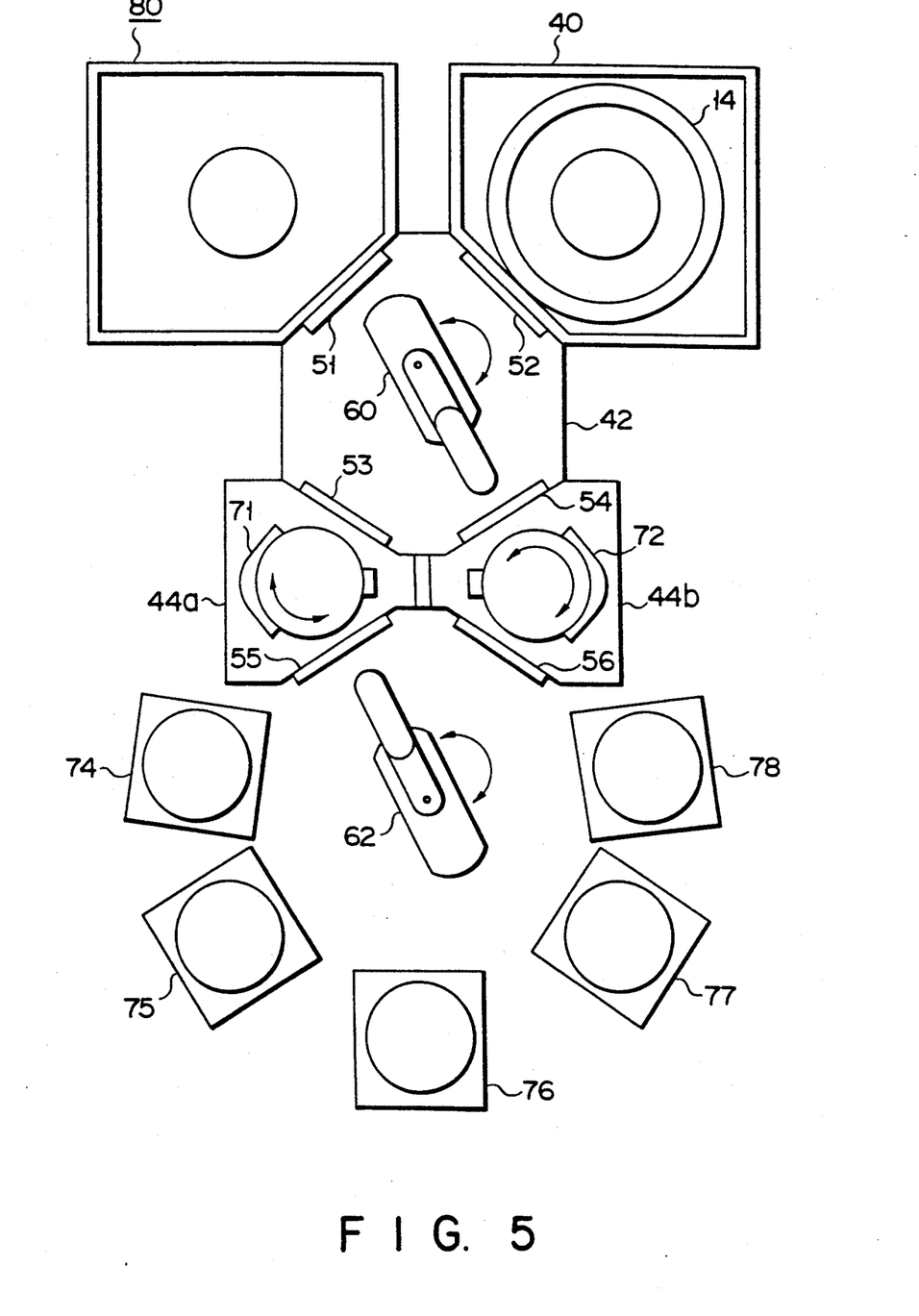

As is shown in FIG. 5, the third load-lock chamber 44 is divided into independent load-lock chambers 44a and 44b. While some waters 20 are conveyed to the load-lock chamber 44a by means of the convey arm 62, other wafers 20 may be taken out from the load-lock chamber 44b by means of the convey arm 60. Thus, the time needed for conveying wafers can be remarkably shortened. Single wafer type orientation flat adjusting mechanisms using optical sensors are provided in the load-lock chambers 44a and 44b. In the state wherein adjustment of orientation flat is attained, the wafers 20 are mounted on the treatment boat 18 and subjected to predetermined heat treatment. Thus, uniform heat treatment can be performed, and the heat-treated wafers 20 can be stored in the cassettes 74 to 78 with orientation flat matched.

The system of the orientation flat adjustment may be provided in locations other than the third load-lock chambers 44. For example, it may be provided in the second load-lock chamber 42 or in the place of installation of the cassettes 74 to 78. When the wafers 20 are taken in or taken out of the load-lock chambers 44, the load-lock chamber 44a is used exclusively for taking-in of wafers 20 and the load-lock chamber 44b is used exclusively for taking-out of wafers 20. Thus, cross-contamination of the wafers 20 can be prevented.

Embodiment 4

Figure 6:
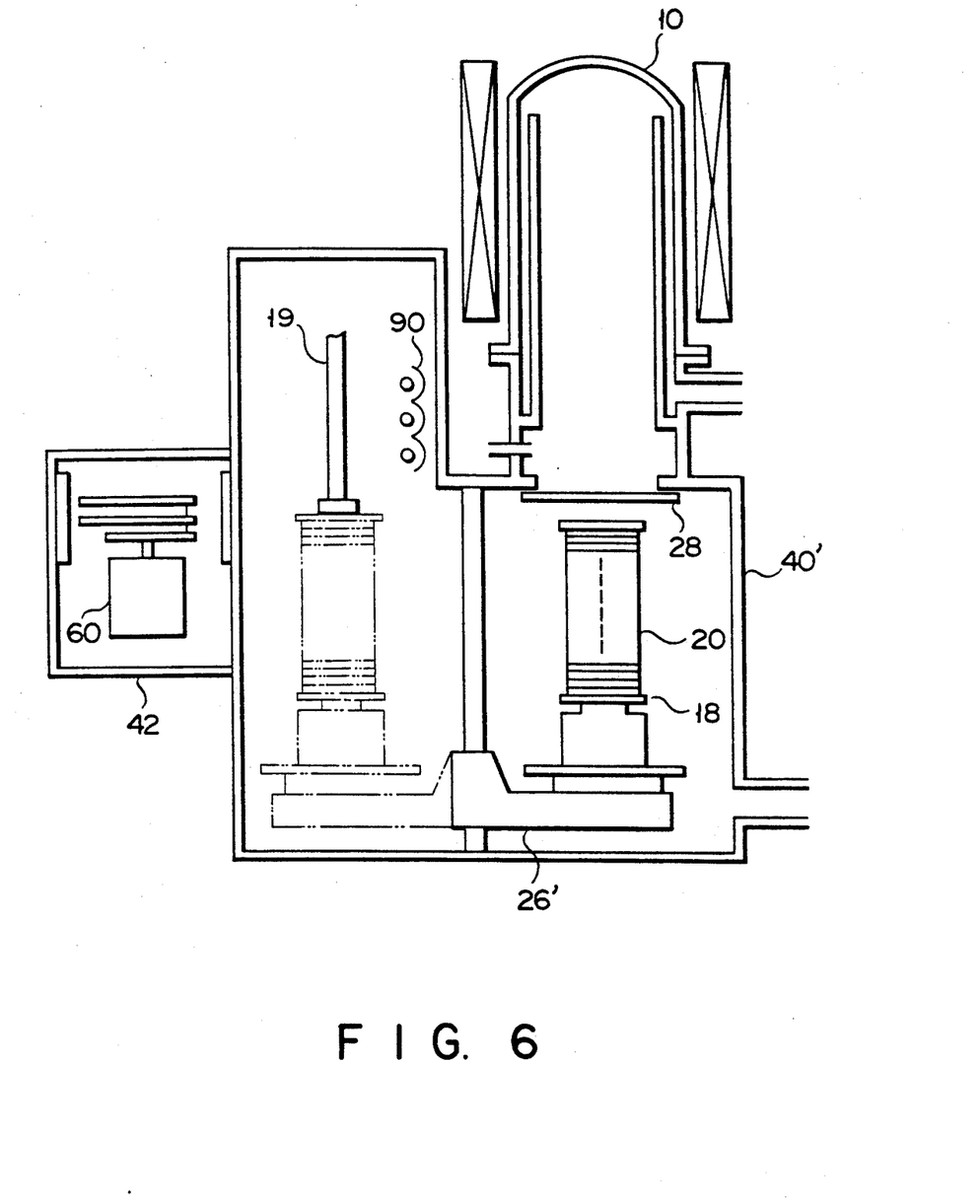

As is shown in FIG. 6, an elevator 26', which is vertically movable and is rotatable about its elevator shaft, is arranged within a first load-lock chamber 40'. A pushing mechanism 19 is provided to push an upper end of the boat 18. After the wafers 20 is positioned, the wafers 20 are transferred from the second load-lock chamber 42.

After the wafers 20 are taken out or taken in on the left side (in FIG. 6) of the first load-lock chamber 40', the elevator 26' is lowered and rotated. Thus, the wafers 20 are set below the process tube 10 and then placed into the process tube 10. By virtue of this structure, the height of the entire apparatus, between the upper end of the process tube 10 and the lower end of the load-lock chamber 40', can be reduced. In addition, the boat 18 can be positioned precisely, and the wafers 20 can be exactly transferred.

The present invention is applicable not only to the film-forming apparatus, such as a CVD apparatus, but also to a treatment apparatus for oxidation or diffusion. In the latter case, too, it is possible to remove the formation of an undesirable, porous, low-quality natural oxidation film. Thus, the yield of semiconductor devices is increased. Dry etching is adopted to remove a natural oxidation film, and may be replaced with plasma etching or ashing.

As has been described above, according to the present invention, the vertical heat treatment unit in which objects are subjected to main treatment is coupled to the dry etching unit via the load-lock chamber. Treatment gas is fed to the dry etching unit to remove natural oxidation films on the objects, before the objects are subjected to the main treatment. Accordingly, when this invention is applied to an apparatus for forming a polysilicon film, a contact resistance with a basic silicon portion can be lowered. Even when this invention is applied to other treatment apparatuses, undesirable natural oxidation films can be removed, and the yield of semiconductor devices can be increased.

Embodiment 5

An apparatus and a method of removing a natural oxidation film in a vertical heat treatment furnace will now be described.

Figure 7:
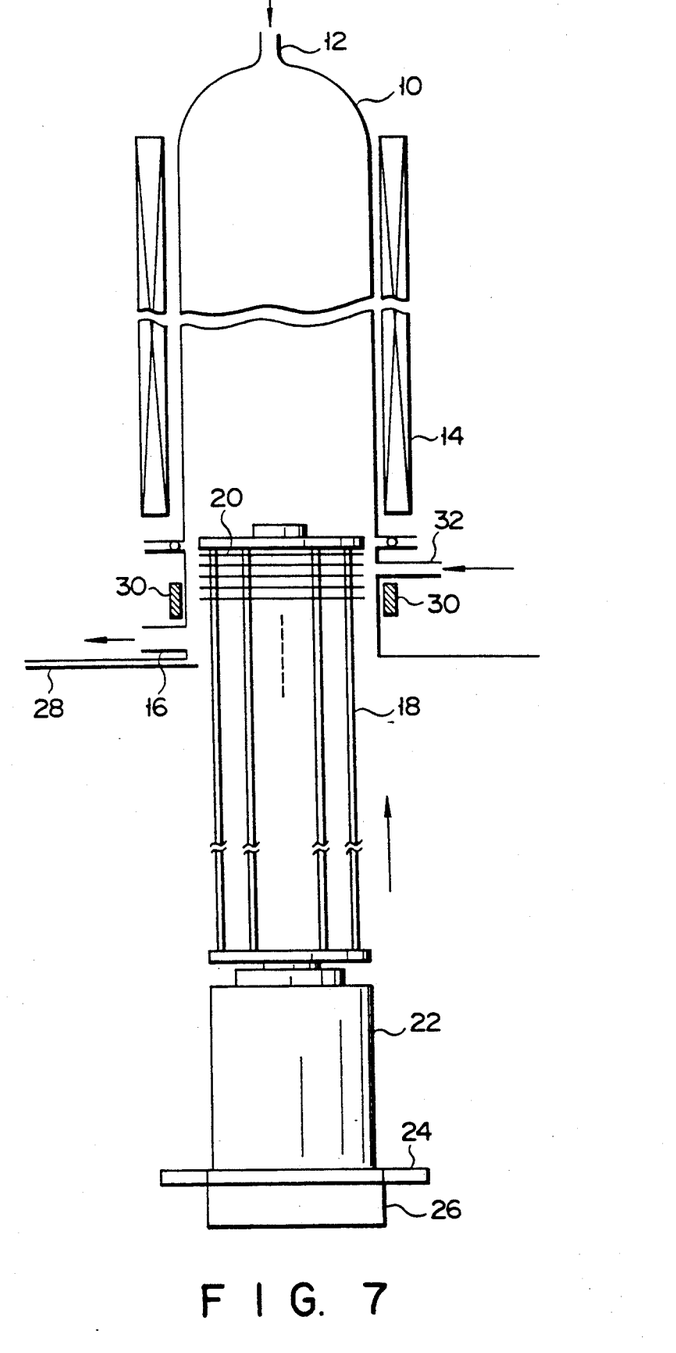
FIG. 7 is a schematic cross-sectional view of a vertical treatment furnace wherein local etching is effected.

FIG. 7 is a schematic cross-sectional view of a vertical oxidizing furnace wherein a wafer is etched while it is being loaded in the vertical oxidizing furnace.

Figure 8:
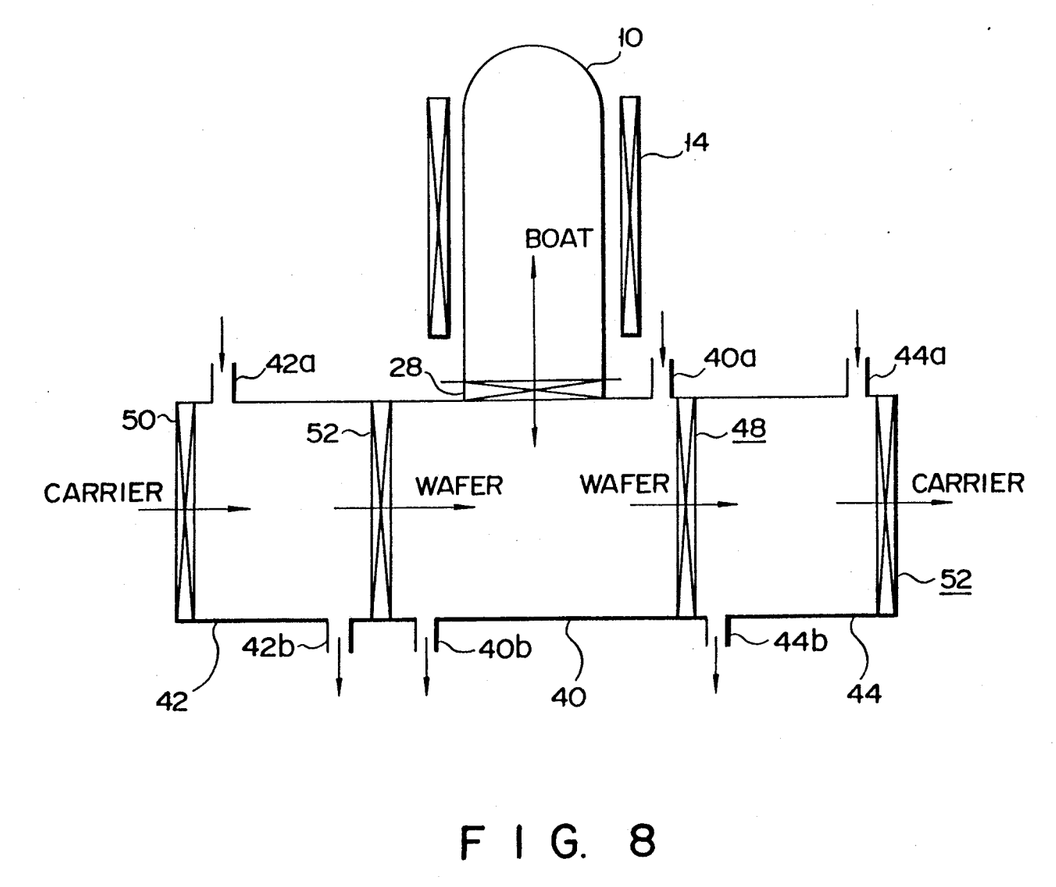
FIG. 8 is a schematic cross-sectional view of an apparatus wherein a load-lock system is adopted in the vertical treatment furnace according to Embodiment 5.

The structure of the process tube 10 in this embodiment is substantially similar to that of the tube 10 employed in Embodiment 1, except that the gas-introducing pipe 12 is connected to an upper end portion of the process tube 10. A process gas is introduced through the pipe 12. The structure of this embodiment is characterized by a plasma etching device for subjecting the wafers 20 mounted on the boat 18 to plasma etching, in the process of loading the boat 18 in the process tube 10. Specifically, the plasma etching device comprises a plasma generating electrode 30 arranged in the vicinity of a region, through which wafers 20 are loaded into the process tube 10, and an etching gas introducing pipe 32 for introducing an etching gas locally to a plasma generation region. The electrode 30 is, for example, a capacitance coupling type electrode formed by opposing two plate-like electrodes, or a inductive coupling type electrode constituted by a coil-like electrode. In this embodiment, too, a load-lock system is adopted, as shown in FIG. 8, in order to suppress the formation of natural oxidation films on the wafers 20 as much as possible. The apparatus of this embodiment does not include the dry etching chamber 80 employed in Example 1. First, second and third load-lock chambers are arranged side by side. The other structural features of Embodiment 5 are similar to those of Embodiment 1, and the common structural parts are denoted by the same numerals.

Figure 9:
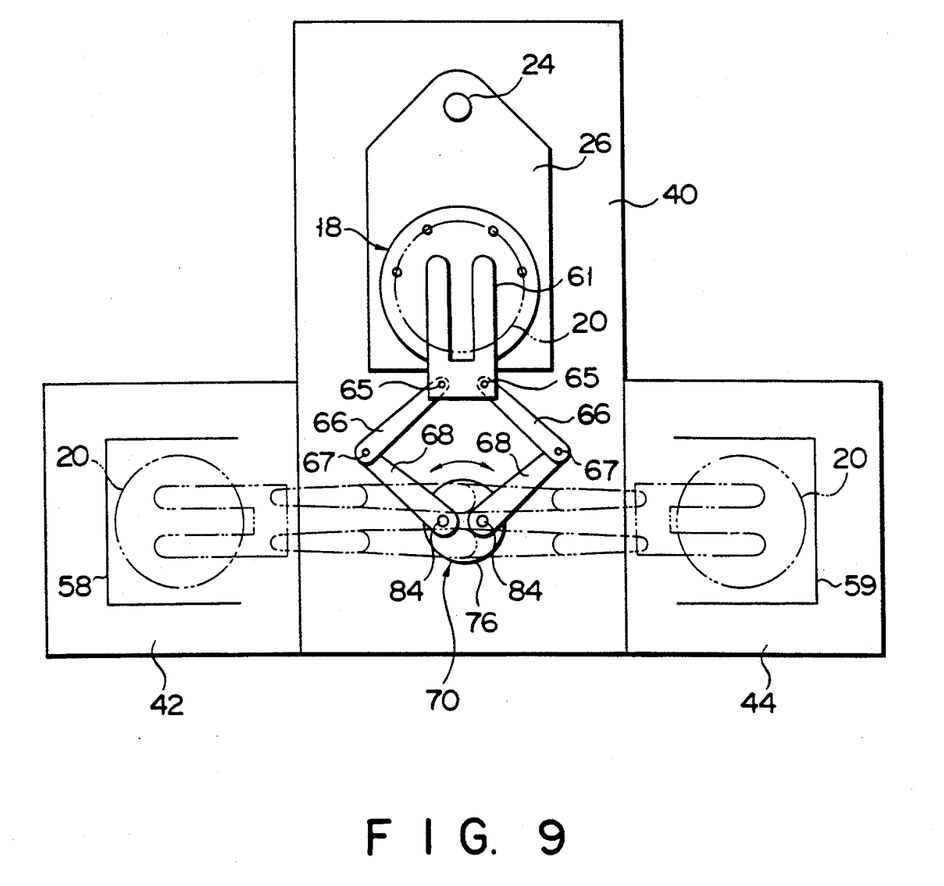
FIG. 9 is a plan view for explaining a convey mechanism for conveying wafers to a plurality of load-lock chambers.

As is shown in FIG. 9, a handler 70 for conveying wafers 20 is arranged within the first load-lock chamber 40. The handler 70 has a forceps 61 for placing and supporting one wafer 20. The forceps 61 is movable to a carrier 58 for carrying wafers 20, which is arranged within the second load-lock chamber 42, to the boat 18 arranged within the first load-lock chamber 40, and to a carrier 59 arranged within the third load-lock chamber 44. The handler 70 in this embodiment has no mechanism for vertical movement. However, the handler 70 is vertically movable relative to the boat 18, in accordance with the boat elevator 26 which is engaged with a ball screw and is vertically moved. On the other hand, the carriers 58 and 59 are vertically moved by means of vertical movement mechanisms (not shown).

The forceps 61 has two links 66 rotatably supported at one end to fulcrums 65. On the other hand, links 68 rotatably supported at fulcrums 67 are attached to a base 76 rotatable in the direction of arrows as shown in FIG. 9. The links 66 and 68 are connected at fulcrums 67 thereby constituting a so-called "flag-leg type" extendible mechanism. The links 66 and 68 are extendibly operated to move the forceps 61 between the carrier 58, boat 18 and carrier 59.

With the above apparatus, the wafers 20 are treated in the following manner. The gate valve 46 is closed, and the gate valve 50 is opened. The carrier is moved in the second load-lock chamber 42. The gate valve 50 is closed and a purge gas is introduced through the gas-introducing pipe 42a to purge the second load-lock chamber 42. The purge gas may be an inert gas such as $N_2$ or Ar, or hydrogen gas ($H_2$). In particular, when hydrogen gas is used as purge gas, the purity of hydrogen gas can be raised very high. Thus, the use of hydrogen gas is effective in exhausting oxygen. In addition, even if hydrogen gas reacts, it performs a reducing action. Thus, oxidation of the wafer 20 can be prevented. Subsequently, a vacuum is created in the first load-lock chamber 40, and the chamber 40 is purged. The wafers 20 is moved to the boat 18 by means of the handler 70. While the boat 18 is being loaded into the process tube 10, local plasma etching is effected to etch natural oxidation films on the wafer 20. More specifically, an etching gas is locally introduced to a region near the lower opening of the process tube 10 through the etching gas introducing pipe 32 (FIG. 7). The electrode 30 is excited to apply an intense electric field to the etching gas, thereby producing a plasma. Thus, the natural oxidation film on the wafer 20 is subjected to plasma etching, in particular, to chemical etching using radicals. Consequently, the thickness of a gate oxide film formed in the process tube 10 can be precisely controlled. The subsequent processes are similar to those in the other embodiments described above.

The load-lock system lowers the possibility of oxidation of wafers 20, when they are loaded in the process tube 10. In addition, when the load-lock system is adopted, the thickness of a natural oxidation film becomes smaller. When the plasma etching is employed and the wafer 20 is formed of silicon, it is desirable that the ratio of $SiO_2/Si$ is high.

Embodiment 6

Figure 10:
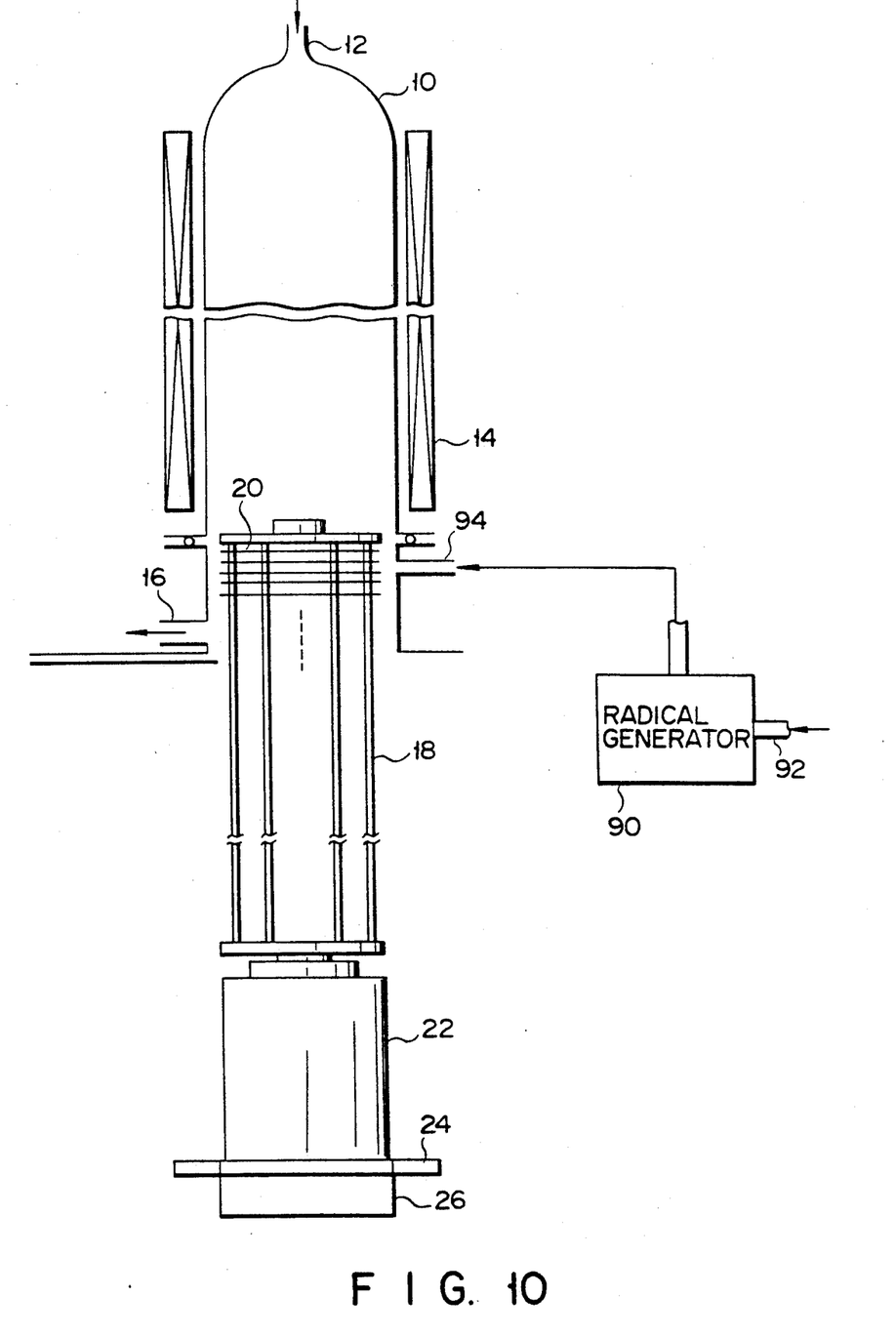
FIG. 10 is a schematic cross-sectional view of a vertical treatment furnace wherein radicals are applied to a part of the vertical treatment furnace.

The method of locally etching the wafers is not limited to Embodiment 5. For example, a method illustrated in FIG. 10 is available. In FIG. 10, a radical generator 90 is arranged on the outside of the process tube 10. An etching gas of $NF_3$ or $H_2$ is introduced to the radical generator 90 through an etching gas introducing pipe 92. An AC voltage of, e.g. 13.56 MHz is applied to the etching gas to produce radicals such as fluorine radicals, hydrogen radicals, etc. The radicals generated in the radical generator 90 is supplied through a radical introducing pipe 94 to the region, through which wafers 20 are loaded into the process tube 10. The radicals are extremely chemically active; therefore, they can remove natural oxidation films on the wafers 20.

Embodiment 7

Figure 11:
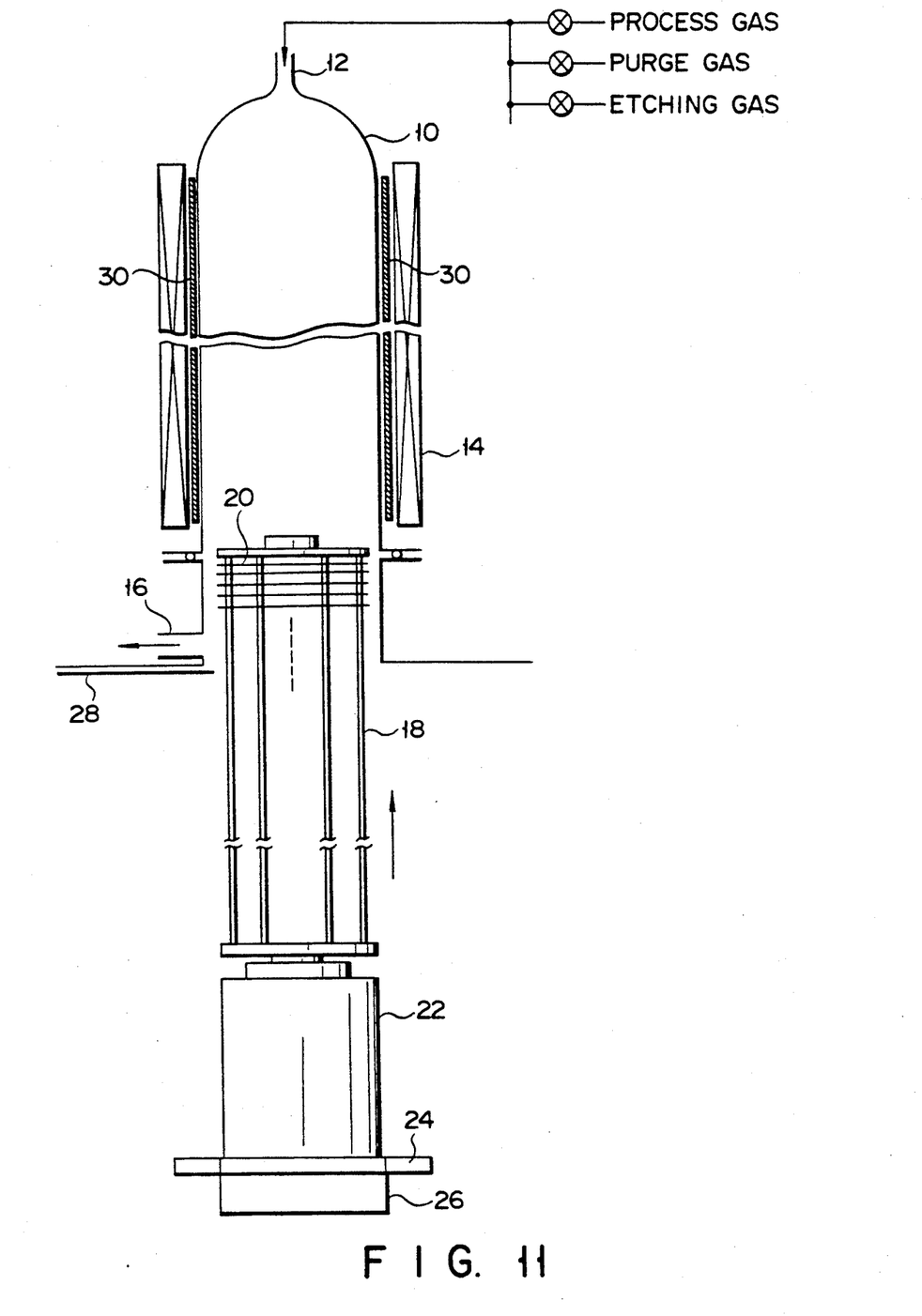
FIG. 11 is a schematic cross-sectional view of a vertical treatment furnace in which a plasma etching is enable.
Figure 12:
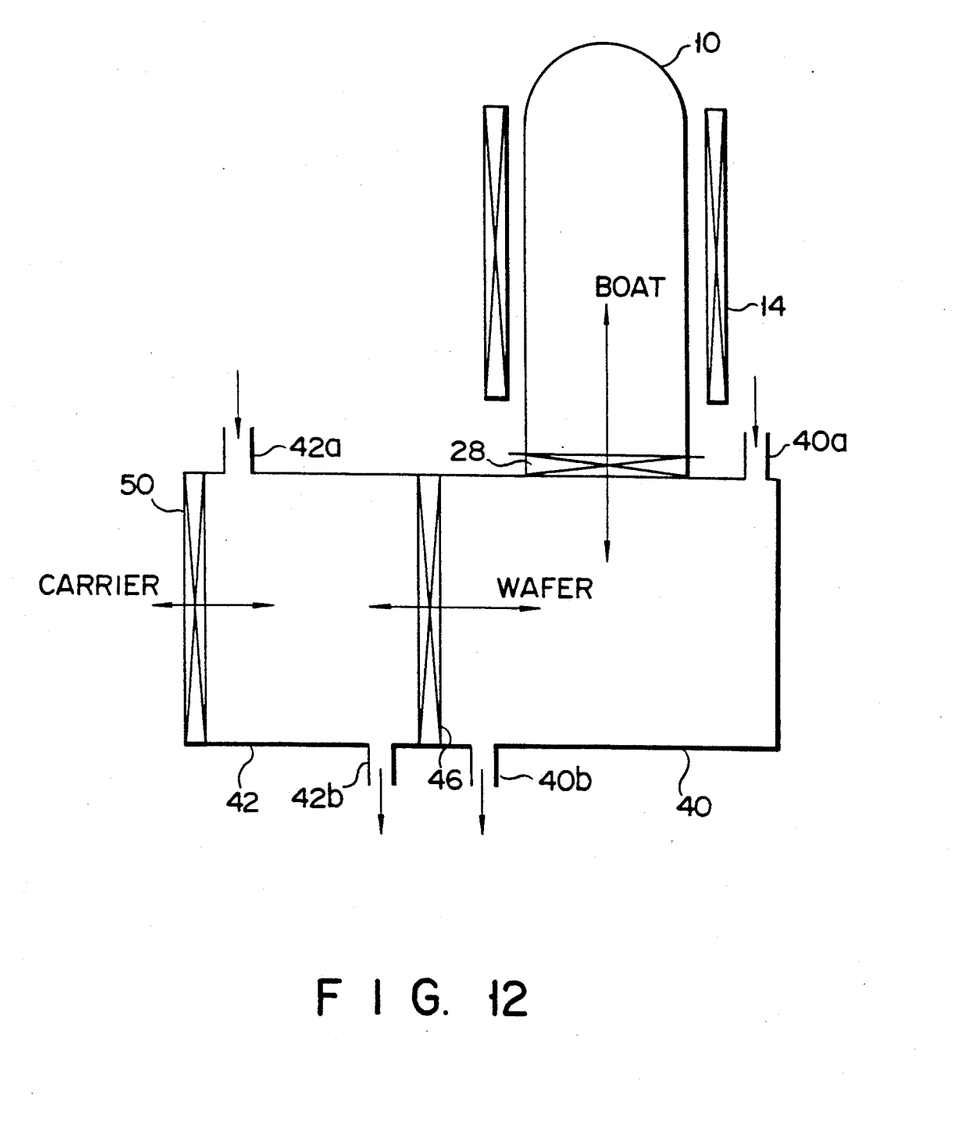
FIG. 12 is a schematic cross-sectional view for explaining a modification of the load-lock system.

Referring to FIGS. 11 and 12, a description will now be given of the case where the process tube 10 for performing a main treatment is also used as an oxide film removing container. In embodiment 7, the local etching device, as employed in Embodiments 5 an 6, is not used. When the wafer is loaded, the heater 14 is driven to heat the process tube 10 up to an etching temperature of 600° C. or 950° C. An etching gas of $NF_3$ or HCl is introduced into the process tube 10 through the gas-introducing pipe 12 which is connected at the top end of the tube 10. Thus, a natural oxidation film on the wafer is removed (FIG. 11).

The vertical treatment furnace is applicable to the removal of the natural oxidation film on the wafer, even when a plasma generation electrode 30 is arranged around the process tube 10 for effecting plasma etching.

When the process tube 10 for performing a main treatment is also used as an oxide film removing container, as in this embodiment, the load-lock system is not necessarily adopted. However, in order to suppress the formation of a natural oxidation film on the wafer 20 as much as possible, it is desirable to adopt the load-lock system. In this case, a system, as shown in FIG. 12, may be employed, if necessary, for the reason of installation space, etc. As is shown in this figure, the third load-lock chamber 44 is not provided, and the second load-lock chamber 42 is employed as a sub chamber for conveying wafers 20 into/out of the first load-lock chamber 40. In this case, since the wafers are conveyed through the same conveying path, the throughput would be lowered. However, since the wafer is conveyed in the atmosphere free from oxygen, the formation of a natural oxidation film can be suppressed as much as possible.

The present invention is applicable not only to an oxide film forming treatment apparatus, but also to an apparatus for forming other films or other treatment apparatuses. In the latter case, too, since this invention can reduce the possibility of formation of natural oxidation films, the yield of semiconductor devices can be increased. Various changes and modifications may be made to the present invention, for example, the number of vertical treatment containers, the type of natural oxidation film removing apparatus, and the location of installation of the natural oxidation film removing apparatus, combinations of such containers or apparatus with the load-lock system.

As has been described in detail, according to the present invention, a natural oxidation film formed on an object can be removed before the object is subjected to a main treatment. Thus, desirable results are attained in the subsequent process, and the yield of products can be increased.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A vertical heat treatment apparatus comprising:
    a first container for heat treating a plurality of wafers stored in a boat forming a film thereon, said first container having a process gas independently introduced thereinto and exhausted therefrom;
    a second container separate from said first container for dry-etching wafers to remove a natural oxidation film on each of said wafers, said second container having an etching gas independently introduced thereinto and exhausted therefrom;
    a first load-lock chamber connected to the lowest portion of said first container via a shutter, said first load-lock chamber having an inert gas independently introduced thereinto and exhausted therefrom;
    a second load-lock chamber connected to said first load-lock chamber via a first gate and to said second container via a second gate, said second load-lock chamber having an inert gas independently introduced thereinto and exhausted therefrom;
    elevate means provided in said first load-lock chamber and having a boat mount to transfer said boat into and out of said first container; and
    transfer means provided in said second load-lock chamber to transfer wafers into and out of said boat mounted on said boat mount.

2. The apparatus according to claim 1, wherein said second container is formed to contain a single wafer at a time, and includes a table for mounting a wafer, said table being rotatable during an etching treatment.

3. The apparatus according to claim 2, wherein said etching gas is HF gas and wherein means for supplying HF gas is connected to said second container.

4. The apparatus according to claim 3, wherein said inert gas is $N_2$.

5. The apparatus according to claim 1, wherein another container for heat treatment is hermetically connected to said second load-lock chamber via another load-lock chamber, said another load-lock chamber being connected to said second load-lock chamber via another gate.

6. The apparatus according to claim 1, wherein a halogen lamp or a xenon lamp is provided between said first and second containers, and in a transfer path of waters, for heating wafers processed in said second container.

7. The apparatus according to claim 1, wherein said transfer means has two convey members for conveying wafers into and out of said boat, said convey members being respectively used before and after the heat treatment.

8. The apparatus according to claim 1, wherein said boat mount is rotatable about a shaft of said elevate means between a first position under said first container and a second position close to said second load-lock chamber.

9. The apparatus according to claim 1, wherein said transfer means is arranged such that is transfers wafers into and out of said second container.

10. A vertical heat treatment apparatus comprising:
    a first container for heat treating a plurality of wafers stored in a boat and forming a film thereon, said first container having a process gas independently introduced thereinto and exhausted therefrom;
    a second container separate from said first container for dry-etching wafers to remove a natural oxidation film on each of said wafers, said second container having an etching gas independently introduced thereinto and exhausted therefrom;
    a first load-lock chamber connected to the lowers portion of said first container via a shutter, said first load-lock chamber having an inert gas independently introduced thereinto and exhausted therefrom;
    a second load-lock chamber connected to said first load-lock chamber via a first gate and to said second container via a second gate, said second load-lock chamber having an inert gas independently introduced thereinto and exhausted therefrom;
    elevate means provided in said first load-lock chamber and having a boat mount to transfer said boat into and out of said first container;
    transfer means provided in said second load-lock chamber to transfer wafers into and out of said boat mounted on said boat mount.
    A third load-lock chamber connected to said second load-lock chamber via a third gate, and having a wafer transfer opening which is closed by a fourth gate; and
    a wafer stocker provided in said third load-lock chamber, for horizontally supporting wafers with intervals therebetween, and being movable up and down.

11. The apparatus according to claim 10, wherein another container for heat treatment is hermetically connected to said second load-lock chamber via another load-lock chamber, said another load-lock chamber being connected to said second load-lock chamber via another gate.

12. The apparatus according to claim 10, wherein a halogen lamp or a xenon lamp is provided between said first and second containers, and in a transfer path of wafers, for heating wafers processed in said second container.

13. The apparatus according to claim 10, wherein said transfer means has two convey members for conveying wafers into and out of said boat, said convey members being respectively used before and after the heat treatment.

14. The apparatus according to claim 10, wherein said boat mount is rotatable about a shaft of said elevate means between a first position under said first container and a second position close to said second load-lock chamber.

15. The apparatus according to claim 10, wherein said second container is formed to contain a single wafer at a time, and includes a table for mounting a waver, said table being rotatable during an etching treatment.

16. The apparatus according to claim 15, wherein said etching gas is HF gas and wherein means for supplying HF gas is connected to said second container.

17. The apparatus according to claim 16, wherein said inert gas is $N_2$.

18. The apparatus according to claim 16, wherein said transfer means is arranged such that it transfers wafers into and out of said second container and said third load-lock chamber.

19. The apparatus according to claim 10, further comprising:

a fourth load-lock chamber connected to said second load-lock chamber via a fifth gate, and having a wafer transfer opening which is closed by a sixth gate; and a wafer stocker provided in said fourth load-lock chamber, for horizontally supporting wafers with intervals therebetween, and being movable up and down.

20. The apparatus according to claim 19, wherein said transfer means is arranged such that it transfers wafers into and out of said second container, and third and fourth load-lock chambers.

* * * * *